United States Patent [19]

Birkholm

[11] Patent Number: 5,260,173
[45] Date of Patent: Nov. 9, 1993

[54] PROCESS FOR LAMINATED ELECTROMAGNETIC RADIATION IMAGED POLYMERIZED MATERIAL WITH A INTEGRAL MEMBRANE

[76] Inventor: James G. Birkholm, 1889 Russell St. NW., Poulsbo, Wash. 98370

[21] Appl. No.: 511,201

[22] Filed: Apr. 19, 1990

[51] Int. Cl.⁵ .................................................. G03C 5/00
[52] U.S. Cl. ...................................... 430/325; 430/258; 430/322; 430/323; 430/329; 430/333
[58] Field of Search ............... 430/258, 325, 333, 323, 430/322, 329, 253

[56] References Cited

U.S. PATENT DOCUMENTS

| | | | |
|---|---|---|---|
| 3,916,050 | 10/1975 | Kurhajec | 428/40 |
| 4,371,602 | 2/1983 | Iwashaki et al. | 430/175 |
| 4,430,416 | 2/1984 | Goto | 430/263 |
| 4,511,640 | 4/1985 | Liu | 430/157 |
| 4,587,186 | 5/1986 | Nakamura | 430/14 |
| 4,716,096 | 12/1987 | Cooper et al. | 430/323 |
| 4,764,449 | 8/1988 | VanIseghem | 430/162 |
| 4,801,490 | 1/1989 | Schuette | 428/211 |

*Primary Examiner*—Charles L. Bowers, Jr.
*Assistant Examiner*—Thorl Chea
*Attorney, Agent, or Firm*—Thomas M. Freiburger

[57] ABSTRACT

A manufacturing process to produce a controllable integral membrane (28) in sheet-like photosensitive laminates (20), said photosensitive laminate being adapted to adhere to the surface to be etched (36). By the use of the present invention the revealed image (33) washes out without detail roots leaving the substrate (22), transfers easily, even if it is very fine, and can be etched on said surface to be etched very nicely.

8 Claims, 2 Drawing Sheets

PROCESS FOR LAMINATED ELECTROMAGNETIC RADIATION IMAGED POLYMERIZED MATERIAL WITH A INTEGRAL MEMBRANE

FIELD OF THE INVENTION

This invention relates to an article of manufacture comprising an adherent sheet-like photoresist laminate which can be transferred to a surface to introduce a pattern into the surface using a particulate etchant such as a sandblast.

More particularly, the invention relates to a photoresist laminate which can be adherently applied to the surface of an object or material, for the purpose of revealing or exposing in the surface of the object or material, a pattern. The resist laminate contains a layer of photoresist composition which when exposed to light a specific desired pattern can be developed when the resist is applied to the surface of the object or material, the pattern can be selectively revealed by the action of an etchant.

BACKGROUND OF THE INVENTION

Over the years a great deal of interest has focused on the art of etching patterns into surfaces of objects. Such patterns can be decorative, informative, can be for the purpose of providing nonskid surface properties, can be useful in forming copper printed wiring board patterns, and can be useful in many other applications where a specific pattern is desired.

Grit blasting has been effected in the past by employing a pattern mask prepared manually from rubber, paper, or various plastics and attaching the pattern mask to the article to be etched employing an adhesive. This method is time consuming and cannot be used to etch fine image details on a repetitive basis.

In the past, expensive metal templates have been held or attached to the surfaces and grit blasted at the templates to produce the etch. This method, since the templates must have small metal parts holding the template together, cannot produce fine detail. Additionally the metal template loses its shape with repeated use, and distorts the design.

The surface of the article can also be etched by silk screen printing an image in relief onto a very fine sticky backing paper. This method requires a very strong ink image. The sticky backing paper is dampened and adhered to the surface. The ink image is then grit blasted. The grit material must, however, penetrate through the paper and its adhesive before affecting the surface. During this time, the ink image must withstand the grit blasting. The resultant image is more of a frost than an etch, and is best suited for producing large numbers of etched items since the method is too costly for etching small numbers of items.

Die cut vinyl stencils are also produced as an etchant mask, and the time, effort and cost factors make the use of such stencils undesirable.

Several companies produce photoresist masks commercially in the United States. Each such mask has a commonalty in that an emulsion containing a photosensitizer and a reactive monomeric and/or polymeric substance is applied to a substrate which is then exposed, either dry or wet, to sufficient quantities of electromagnetic radiation of an appropriate wave length to activate polymerization or crosslinking catalysts, agents, initiators or mixtures thereof. The unexposed areas remain soluble to the action of solvents such as water, alcohols, hexane, benzene and when exposed to such solvents by the use of a washout device reveal the desired pattern or design. The exposed areas are rendered insoluble and form the mask. While the commercial productions can produce reasonable detail, some detail is destroyed during the washout. The method by which these masks are, by simple adhesive, transferred to the object to be etched, requires the masks to be burnished while applying. The failure rate for loss of pieces and fine detail which does not make the transfer, or is blown off the glass in the blasting is substantial.

One American company produces a laminated resist, produced much the same as the previous commercial mask, which has as an additional production step a thin film laminated to the polymerized resist. The transfer of this mask is better, but the production costs of this additional step make the mask very expensive. The loss of fine detail during washout is a problem.

Liquid photoresists are also commercially available which are painted or sprayed onto the surface of the object to be etched, and then exposed when dry to achieve a desired image. While the process does work, there are serious problems when working with any but a planer surface, and presents problems on water sensitive surfaces. The process is time consuming, expensive, and must be cleaned using special expensive removers.

Accordingly, a substantial need exists for a photoresist that is extremely easy to use, can readily develop an image or pattern, can be used on both water sensitive surfaces and surfaces having curves and contours. Such a photoresist, which can be produced quickly and inexpensively while providing extremely fine detail which transfers intact and adheres so fine detail is not blown off during the blasting is in demand, and is being successfully marketed by the inventor under the trademark of E-Z MASK.

BRIEF DISCUSSION OF THE INVENTION

I have found that by exposing a previously imaged photoresist sheet to a proper amount of electromagnetic radiation for a specific time period, prior to exposure to solvents by the use of a washout device, I can produce a controllable integral membrane layer in the imaged photoresist sheet. Surprisingly, I have found that when exposed to solvent by use of a washout device, the integral membrane remains intact, and greatly enhances the amount of detail that is available for transfer. By being integral, this membrane actually increases the amount of fine detail that can be easily transferred to the object to be etched. Using this invention line widths of 0.0039 inches can be imaged, washed out, transferred and successfully etched. Additionally I have found that:
  (a) The method is very simple.
  (b) No appreciable additional costs are incurred.
  (c) Compound and inward curves can be masked without distortion.
  (d) Water sensitive materials can be masked and etched without damage.
  (e) Substrate material can be quickly and easily stripped off.
  (f) Application time of the mask on object to be etched is greatly reduced.
  (g) Clean up or mask removal is fast; no special agents needed.
  (h) Etching time is reduced per object since all detail stays in place, resulting in increased production.

(i) Better resolution, finer detail, and higher quality are produced which increases product sales.

REFERENCE NUMERALS IN DRAWINGS

Figure 1:
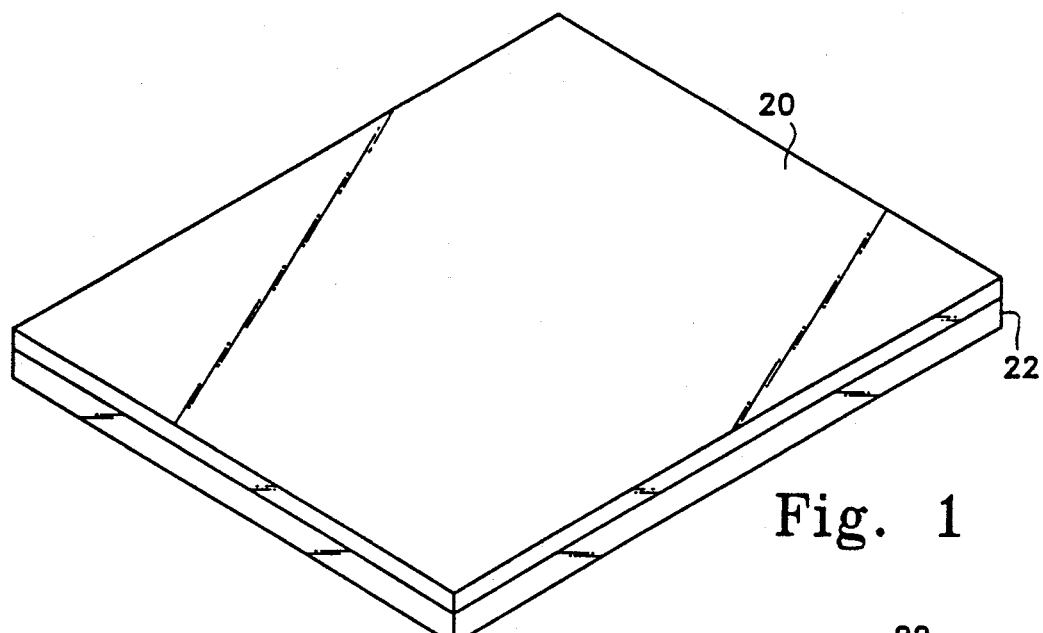
FIG. 1 is a view of a generally rectangle portion diagram of a preferred resist laminate which is made of a substrate which has been coated with a photosensitive resist.

| | |
|---|---|
| 20 photo sensitive resist | 33 revealed image |
| 22 substrate | 34 adhesive layer |
| 24 electromagnetic source | 36 surface to be etched |
| 25 timing device | 38 etched area |
| 26 unrevealed image | 40 abrasion etching device |
| 27 image transfer means | 42 abrasive |
| 28 integral membrane | 44 repelled abrasive |
| 30 wash out device | 46 etched image |
| 32 water or chemical solvent spray | |

DETAILED DISCUSSION OF THE INVENTION

Resist Layer

The resist laminate of the invention generally is made of a resist layer, a substrate layer, and an adhesive layer.

The resist layer of the laminate generally comprises compositions that are photosensitive. The photosensitive compositions typically interact with light to transform the composition from a soluble state into an insoluble film. Typically, resist compositions contain reactive mono/or polymeric substances along with photo activated initiators. Such polymer suspensions are well known in the art and are available from a number of suppliers.

One of the preferred resists is sold by The Chromaline Corporation under the name of SBX.

Substrate

The support layer of this invention commonly comprises a web, film, or other such substrate which can be coated with the resist composition of the invention. The substrate must be mechanically strong to permit rapid manufacture of the resist laminate and must be flexible to allow for the easy removal after transfer of the resist mask to the object to be etched.

Such substrate materials are readily available from a number of suppliers.

The preferred substrate of this invention is a transparent or translucent sheet-like material which is less than 4 mil mylar polyester, produced by DuPont.

Adhesive Layer

The photoresist laminate of the invention comprises an adhesive layer that is used to adherently apply the laminate to the object for etching. The adhesive layer can be water activated, pressure sensitive, heat activated, or other adhesive form. The adhesive layer is preferably a pressure sensitive adhesive which is typically an adhesive composition having a high degree of tack and cohesive strength. Such adhesives may be applied by a large variety of means; spray, brush, roll coating, or in the photoresist polymer suspension.

Pressure sensitive adhesives tend to bond almost instantaneously to a surface with slight contact pressure at the interface between the adhesive and the contacted surface. In practice pressure sensitive adhesives commonly are used in conjunction with a pressure sensitive release liner comprising a backing material such as paper, textile, plastic film, or metal foil which has a generally silicone release coating to ensure that a release liner can be removed from the pressure sensitive adhesive without reducing the adhesive properties of the adhesive mass and without any removal of the pressure sensitive adhesive. The removable release liner makes it practical to store imaged sheets with the adhesive applied for later use, or for shipment.

The preferred pressure sensitive adhesives are well known to the art, and are commonly available through a variety of sources including 3-M.

Methods of Use

The photoresist laminate articles of manufacture of the invention are typically used by adhering the exposed, re-exposed, washed out laminate to the object to be etched. The substrate is stripped off and the resist is exposed to the action of a particulate etchant. Many variations of this basic etching process can be formed without departing from the spirit and scope of the invention since the steps can be rearranged to suit a particular resist laminate construction, and the desired end use of the resultant sheets.

FIG. 1 is a diagram of a generally rectangle portion of a preferred resist laminate which is made of a substrate 22 which has been coated with a photosensitive resist 20. The coating may be produced by various well known coating methods, and can be applied in a variety of thicknesses directly related to the intended use of the resist. The preferred thickness of the photosensitive resist 20 is between 3 mil and 5 mil.

Figure 2:
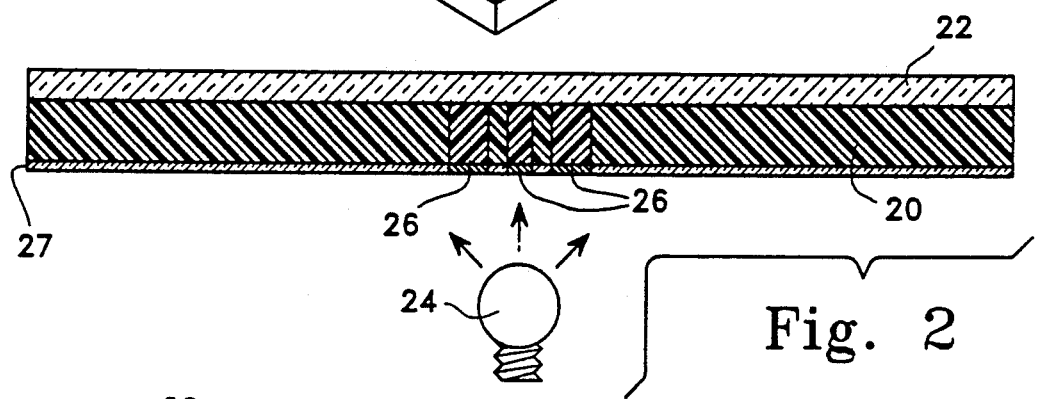
FIG. 2 is an enlarged side view diagram of a method of forming an unrevealed pattern in the surface of the photosensitive resist by exposure to a film image and a electromagnetic radiation source.

FIG. 2 is an enlarged side view diagram of a method of forming an unrevealed image 26 in the surface of the photosensitive resist 20, by exposure to a image transfer means 27 and a electromagnetic radiation source 24. This known art generally requires sufficient electromagnetic radiation 24 to be applied to photosensitive resist 20 to cause the crosslinking or polymerization of the resist into an insoluble state. The image transfer means 27 repels the electromagnetic radiation 24 and the unrevealed image 26 remains soluble.

Figure 3:
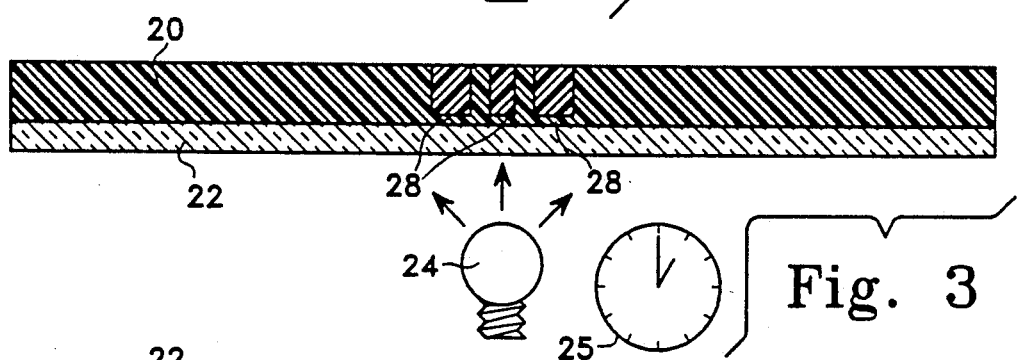
FIG. 3 is an enlarged side view diagram of a method of forming an integral membrane in the previously imaged photo resist sheet, FIG. 2.

FIG. 3 is an enlarged side view diagram of a method of forming an integral membrane 28 in the previously imaged photosensitive resist sheet FIG. 2. The previously imaged photosensitive resist sheet is re-introduced, or exposed a second time to the electromagnetic radiation 24. The image transfer means 27 is not present. The preferred method exposes the laminate with the photosensitive resist 20 in the reverse of FIG. 2, with the substrate 22 in the direct path of the electromagnetic radiation 24. The areas of unrevealed image 26 are now briefly exposed for a specific time period, using a timing device 25, through the substrate 22, forming a integral membrane 28. The specific time to produce the membrane varies in direct relation to the time of electromagnetic radiation from a specific source, and is a well known art. The steps can be rearranged to suit a particular manufacturing or use method with substantially the same results.

Figure 4:
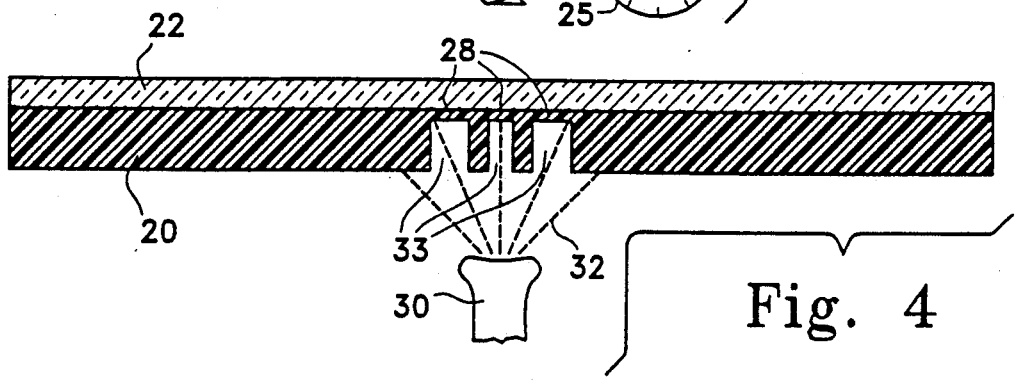
FIG. 4 is an enlarged side view diagram of the wash out device, and water or chemical solvent spray, revealing the imaged pattern, leaving the integral membrane intact on the substrate.

FIG. 4 is an enlarged side view diagram of the wash out device 30, and water or chemical solvent spray 32, revealing the revealed image 33 and the integral membrane 28 left intact on the substrate 22. The integral membrane 28 spans all the revealed image areas 33 and has held them in place during the wash out process. The stabilizing effect of the integral membrane greatly improves the resolution capability of the photosensitive resist since all fine detail is held in place, and is not eroded at the roots.

Figure 5:
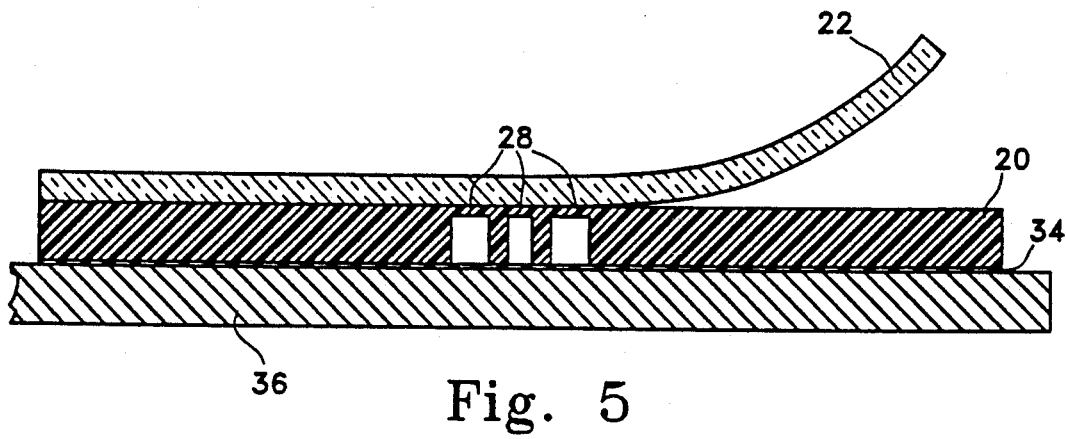
FIG. 5 is an enlarged side view diagram of the imaged photoresist, applied to the object to be etched, by means of an adhesive coating. The integral membrane holds all pattern pieces in place while the substrate is stripped away.

FIG. 5 is an enlarged side view diagram of the imaged photoresist 20, applied to the object to be etched 36, by the means of an adhesive coating 34. The integral membrane 28 now holds all pattern pieces in place without loss or distortion while substrate 22 is stripped away manually. The transfer method allows previously difficult surfaces including compound and inward curves to be successfully masked, as well as application to other surfaces which are sensitive to the presence of water.

Figure 6:
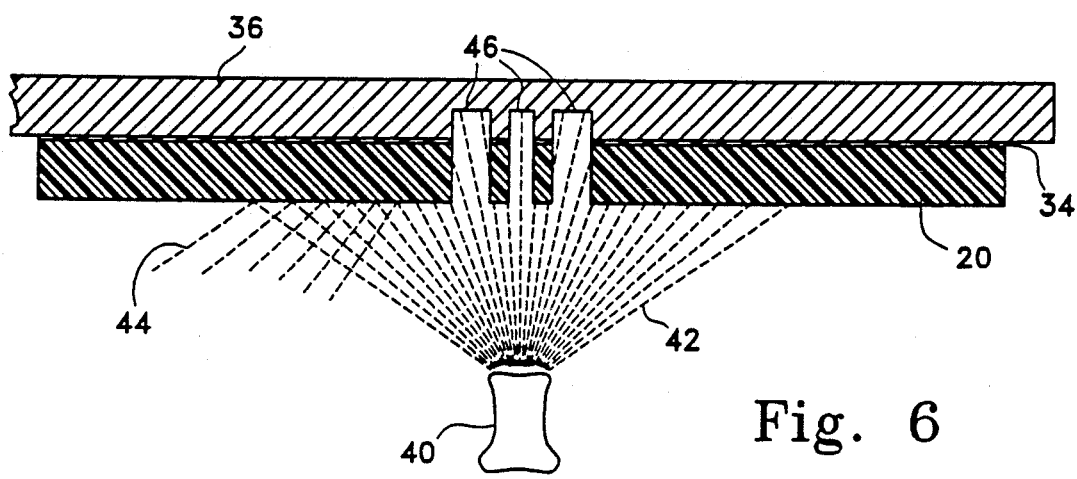
FIG. 6 is an enlarged side view diagram of the applied photoresist, on the object to be etched, being blasted with an abrasive, propelled from an abrasion etching device, producing an etched pattern in the object.

FIG. 6 is an enlarged side view diagram of the applied photoresist 20, applied to the object to be etched 36, by means of an adhesive coating 34. The integral membrane 28 holds the various small parts in place while exposed to the abrasive 42. The membrane rapidly erodes when exposed to the action of the abrasive, and after sufficient exposure to the etchant, the etched image 46 is developed in the object surface. The holding in place of the small pieces by the membrane allows deeper etching of the image since the small pieces do not blow off.

Figure 7:
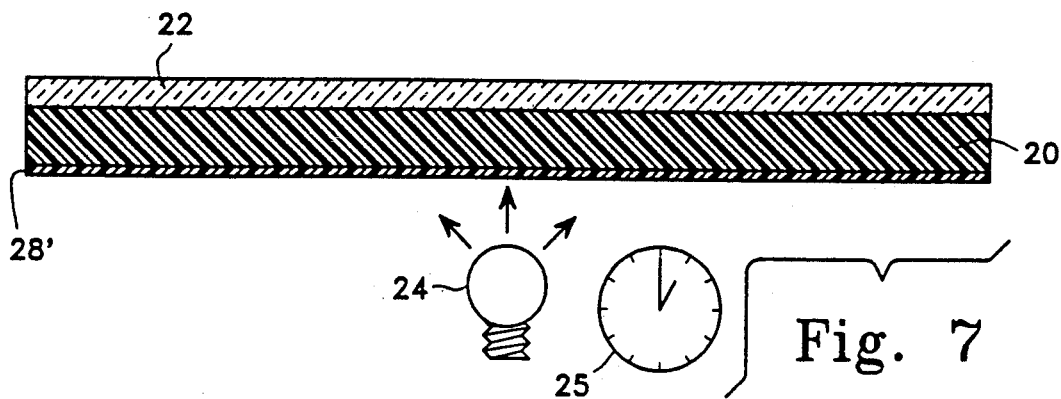
FIG. 7 is ah enlarged side diagram of a method of forming and integral membrane in photosensitive laminates for later use.

FIG. 7 is an enlarged side view diagram of the photoresist 20 on substrate 22 exposed to electromagnetic radiation 24. The preferred method for producing photoresist laminates for storage or shipment for use at a later time is to expose the laminate briefly for a specific time to produce the membrane by means of a timing device 25 and deposit the exposed laminate in exposure proof means for later re-exposure, FIG. 2, washout FIG. 4, application with adhesive coating FIG. 5, stripping of substrate FIG. 5, and etching FIG. 6.

Although the description above contains many specifications these should not be construed as limiting the scope of the invention but as merely providing illustrations of some of the presently preferred embodiments of this invention. For example, the invention can be utilized on sheets which are produced and exposed while liquid or semi-liquid as well as dry.

Thus the scope of the invention should be determined by the appended claims and their legal equivalents, rather than by the examples given.

I claim:

1. A process for producing a controllable integral membrane in a radiation-sensitive composition laminate, for transfer to a surface for use in applying a pattern to the surface, comprising the steps of:
   (a) exposing the radiation-sensitive composition laminate, having image transfer means thereon, to electromagnetic radiation to form an unrevealed image, said laminate being developable with aqueous media and having a radiation sensitive resist side and a transparent substrate side, to electromagnetic radiation, with the image transfer means on the resist side to produce an unrevealed image,
   (b) exposing said laminate, with the unrevealed image, to electromagnetic radiation, from the transparent substrate side, to produce a controlled integral membrane, and
   (c) without said image transfer means, washing out the laminate at the unrevealed image to remove the laminate at the unrevealed image other than the integral membrane, thus to reveal the unrevealed image and the uncontrolled integral membrane.

2. A process according to claim 1, wherein the step of exposing which produces the controlled integral membrane is performed after the step of exposing which produces the unrevealed image.

3. A process according to claim 1, wherein the electromagnetic radiation is light.

4. A process according to claim 1, wherein the radiation-sensitive composition laminate comprises a material capable of changing from a soluble form prior to exposure to an insoluble form after exposure.

5. A process according to claim 1, including a step of adhering the laminate to a surface for use in applying a pattern to the surface.

6. A process according to claim 5, wherein the substrate is adapted to be manually removed from the laminate prior to a pattern application.

7. A process according to claim 5, including a further step of using the laminate on the surface to etch a pattern on the surface by means of a particulate etchant.

8. A manufacturing process for producing a controllable integral membrane in a radiation sensitive laminate for transfer, the laminate having a transparent substrate side and a radiation sensitive resist side, comprising the steps of:
   (a) exposing the radiation sensitive laminate to radiation from the substrate side for a specific period of time without use of any image transfer means, to produce a controlled integral membrane;
   (b) depositing the exposed radiation sensitive laminate in light exposure proof means;
   (c) removing the exposed radiation sensitive laminate from the light exposure proof means and exposing the laminate to radiation on the radiation sensitive resist side of the laminate with an image transfer means to produce an unrevealed image;
   (d) washing out the radiation sensitive resist side to reveal the unrevealed image and controlled integral membrane.

* * * * *

UNITED STATES PATENT AND TRADEMARK OFFICE
CERTIFICATE OF CORRECTION

PATENT NO. : 5,260,173
DATED : November 9, 1993
INVENTOR(S) : James G. Birkholm

It is certified that error appears in the above—identified patent and that said Letters Patent is hereby corrected as shown below:

Column 6, lines 14-15, delete "to electromagnetic radiation,"

Column 6, line 16, delete "to produce an unrevealed image"

Column 6, line 25, correct "uncontrolled" to read --controlled--.

Signed and Sealed this

Seventh Day of February, 1995

*Attest:*

BRUCE LEHMAN

*Attesting Officer*      *Commissioner of Patents and Trademarks*